(12) United States Patent
Mirgorodski et al.

(10) Patent No.: US 6,621,736 B1
(45) Date of Patent: Sep. 16, 2003

(54) METHOD OF PROGRAMMING A SPLIT-GATE FLASH MEMORY CELL WITH A POSITIVE INHIBITING WORD LINE VOLTAGE

(75) Inventors: Yuri Mirgorodski, San Jose, CA (US); Pavel Poplevine, Foster City, CA (US); Mark W. Poulter, Berkeley, CA (US)

(73) Assignee: National Semiconductor Corporation, Santa Clara, CA (US)

(*) Notice: Subject to any disclaimer, the term of this patent is extended or adjusted under 35 U.S.C. 154(b) by 43 days.

(21) Appl. No.: 10/091,927

(22) Filed: Mar. 5, 2002

(51) Int. Cl.$^7$ ................................ G11C 16/04
(52) U.S. Cl. ..................... 365/185.18; 365/185.11; 365/195
(58) Field of Search ............. 365/185.18, 185.26, 365/195, 189.01, 185.05, 185.11

(56) References Cited

U.S. PATENT DOCUMENTS 5,831,905 A * 11/1998 Hirano ................. 365/185.29
6,181,483 B1 * 1/2001 Takatsuki ............... 359/691
6,466,483 B1 * 10/2002 Parker .................. 365/185.28
6,477,088 B2 * 11/2002 Ogura et al. ........... 365/185.29

OTHER PUBLICATIONS

Silicon Storage Technology, Inc. "SuperFlash EEPROM Technology Technical Paper", Revised Mar. 1999, pps. 1–7.

Silicon Storage Technology, Inc. "Technical Comparison of Floating Gate Reprogrammable Nonvolatile Memories", Revised Mar. 1999, pps. 1–7.

* cited by examiner

*Primary Examiner*—Son T. Dinh
(74) *Attorney, Agent, or Firm*—Mark C. Pickering

(57) ABSTRACT

A split-gate flash memory array is programmed, in part, by applying a programming voltage to the row of cells that include the to-be-programmed cells, and an inhibiting voltage to the row of cells that share the same source line as the row that includes the to-be-programmed cells. The inhibiting voltage is greater than zero and less than the programming voltage.

14 Claims, 2 Drawing Sheets

METHOD OF PROGRAMMING A SPLIT-GATE FLASH MEMORY CELL WITH A POSITIVE INHIBITING WORD LINE VOLTAGE

BACKGROUND OF THE INVENTION

1. Field of the Invention

The present invention relates to a method of programming a split-gate flash memory cell and, more particularly, to a method of programming a split-gate flash memory cell with a positive inhibiting word line voltage.

2. Description of the Related Art

A non-volatile memory cell is a memory cell that retains data stored in the cell after power has been removed from the cell. One type of non-volatile memory cell is a split-gate flash memory cell. A split-gate flash memory cell, also known as a transistor and a half memory cell, integrates a memory transistor and an access transistor.

FIG. 1 shows a cross-sectional diagram that illustrates a prior art split-gate flash memory cell 100. As shown in FIG. 1, memory cell 100, which is formed in a p-type semiconductor substrate 110, includes a n++ source region 112 that is formed in substrate 110, and a n+ drain region 114 that is formed in substrate 110 a distance apart-from source region 112.

As further shown in FIG. 1, memory cell 100 also includes a channel region 116 that is located between source and drain regions 112 and 114. Channel region 116, in turn, includes a source-side channel region 116A, a drain-side channel region 116B, and an intermediate channel region 116C connected to source-side channel region 116A and a drain-side channel region 116B.

In addition, memory cell 100 includes a layer of gate oxide 120 that is formed over channel region 116, and a polysilicon floating gate 122 that is formed on gate oxide layer 120 over source region 112 and source-side channel region 116A. Floating gate 122, in turn, has a tip 124 that is located at the outer edge of floating gate 122.

Further, memory cell 100 includes a layer of interpoly dielectric 126 that is formed on gate oxide layer 120 and the side wall of floating gate 122 over intermediate channel region 116C, and over floating gate 122. Cell 100 additionally includes a polysilicon control gate 130 that is formed on gate oxide layer 120 over the drain-side channel region 116B, and on interpoly dielectric layer 126 over intermediate channel region 116C, floating gate 122, and source-side channel region 116A.

In operation, cell 100 is read by placing ground on source region 112, a positive drain voltage on drain region 114, and a read voltage on control gate 130. Under these conditions, when cell 100 is unprogrammed, the read voltage is sufficient to invert channel region 116 and allow a current to flow from drain region 114 to source region 112. The presence of current, in turn, is interpreted to be a first logic state.

On the other hand, when cell 100 is programmed, the read voltage is insufficient to invert source-side channel region 116A, thereby preventing a current from flowing from drain region 114 to source region 112. In this case, the absence of current is interpreted to be a second logic state.

In addition to reading, cell 100 is erased by placing ground on substrate 110, source region 112, and drain region 114. In addition, an erase voltage is placed on control gate 130. The erase voltage can be, for example, 10V These voltages set up an electric field from floating gate 122 to control gate 130 across interpoly dielectric layer 126.

Tip 124, in turn, intensifies the electric field across interpoly dielectric layer 126. Thus, under the influence of the intensified electric field, the electrons on floating gate 122 tunnel through interpoly dielectric layer 126 from tip 124 to control gate 130 via the well known Fowler-Nordheim mechanism.

One of the advantages of cell 100 is that, as a result of the intensification of the electric field, lower voltages can be applied to cell 100 to achieve erasure than are required for other types of cells. The amount of intensification provided by tip 124 is largely a factor of the shape of tip 124.

In addition to reading and erasing, cell 100 is programmed by placing a source voltage, such as 10 volts, on source region 112, and a drain voltage, such as 1V, on drain region 114. In addition, a control gate voltage which is at least a threshold voltage greater than the drain voltage is placed on control gate 130. For example, when 1V is placed on drain region 114, approximately 1.7V can be placed on control gate 130.

The control gate voltage on control gate 130 attracts electrons to the surface of channel region 116. The voltage difference between source region 112 and drain region 114 sets up an electric field. The presence of sufficient electrons at the surface of channel region 116 allows electrons to flow from drain region 114 to source region 112 along the surface of channel region 116 under the influence of the electric field.

The electric field intensifies in the intermediate channel region 116C. The electrons are accelerated by the intensified electric field into having ionizing collisions with the lattice which, in turn, generate hot electrons. The hot electrons have additional collisions with the lattice producing additional hot electrons to form a hot electron programming current.

A number of the hot electrons penetrate gate oxide layer 120 and accumulate on floating gate 122, thereby programming the cell. When cell 100 is read, the negative charge on floating gate 122 from the accumulated electrons prevents the read voltage from inverting source-side channel region 116A.

FIG. 2 shows a schematic diagram that illustrates a prior art, split-gate memory array 200. As shown in FIG. 2, array 200 includes a -plurality of split-gate memory cells 100 that are arranged in rows and columns. In addition, array 200 includes a plurality of source lines SL1–SLn that are formed such that each source line SL is connected to each source region 112 in two adjacent rows of cells 100.

Array 200 also includes a plurality of bit lines BL1–BLm that are formed such that each bit line BL is connected to each drain region 114 in a column of drain regions 114. Further, array 200 includes a plurality of word lines WL1–WLs that are formed such that each word line WL is connected to each control gate 130 in a row of memory cells 100.

In operation, when the memory cells 100 in a row of cells in array 200 are to be programmed, a source voltage, such as 10 volts, is placed on the source line SL that is connected to the to-be-programmed memory cells. In addition, ground is placed on the remaining source lines SL. For example, if memory cells in the first row are to be programmed, the source voltage is placed on source line SL1 while ground is placed on the remaining source lines SLn.

Further, a first bit voltage, such as 1V, is placed on each bit line BL that is connected to a to-be-programmed memory cell 100. In addition, an second bit voltage, such as 2.5 volts, is placed on each bit line BL that is connected to a not to-be-programmed memory cell 100. For example, if cell A is to be programmed and cell C is not to be programmed, then 1V is placed on bit line BL1, while 2.5V are placed on bit line BL2.

In addition, a programming voltage, such as 1.7V, is placed on the word line WL that is connected to the to-be-programmed memory cells. Ground, in turn, is placed on the remaining word lines WL. For example, if the first row of cells is to be programmed, the programming voltage is placed on word line WL1, while ground is placed on word lines WL2–WLs. Further, ground is placed on substrate 110. Under these programming conditions, each to-be-programmed cell 100 in the first row of cells is programmed.

One problem with array 200 is that when the memory cells in one row of cells are programmed, cells in an adjacent row of cells are undesirably programmed over time. As shown in FIG. 2 when cell A is programmed, cell B experiences the same source and bit voltages as cell A. Similarly, cell D shares the same source and bit voltages as cell C, and the same source voltage as cell A.

As noted above, when memory cells in the first row are programmed, a programming voltage is applied to word line WL1, and ground is applied to word line WL2. When ground is placed on word line WL2, insufficient electrons are present at the surfaces of the channel regions 116 of the cells in the second row to support an electron flow from the drain regions 114 to the source regions 112 of the cells.

However, even though ground is placed on word line WL2, a small number of hot electrons continue to be generated due to impact ionization and band-to-band tunneling. A number of these hot electrons are injected into the floating gates of the memory cells in the second row which, over time, undesirably programs the cells.

Thus, there is a need for a method of programming array 200 that reduces the undesirable programming that occurs when not to-be-programmed memory cells share the same source voltages as the to-be-programmed memory cells.

SUMMARY OF THE INVENTION

The present invention provides a method of programming a memory array that reduces the undesirable programming that occurs when not to-be-programmed memory cells share the same source and bit voltages as to-be-programmed memory cells. The memory array of the present invention has a plurality of memory cells that are formed in rows and columns. Each memory cell has a source region, a drain region, a floating gate, and a control gate that is formed over the floating gate. A first row of cells has a to-be-programmed memory cell, while a second row of cells has a first not-to-be programmed memory cell.

The memory array also has a plurality of source lines that are formed such that each source line is connected to each source region in two adjacent rows of cells. A source line is connected to each source region in the first and second rows of cells. The memory array further has a plurality of bit lines that are formed such that each bit line is connected to each drain region in a column of drain regions. A bit line is connected to the drain region of the to-be-programmed memory cell and the drain region of the first not to-be-programmed memory cell.

In addition, the memory also has a plurality of word lines that are formed such that each word line is connected to each control gate in a row of memory cells. A first word line is connected to each control gate in the first row of memory cells, while a second word line is connected to each control gate in the second row of memory cells.

In accordance with the present invention, the method includes the steps of placing a source voltage on the source line connected to each source region in the first and second rows of cells. The method also includes the step of placing a bit voltage on the bit line connected to the drain region of the to-be-programmed memory cell and the drain region of the first not to-be-programmed memory cell.

In addition, the method includes the step of placing a word voltage on the first word line, and placing an inhibiting voltage on the second word line. The inhibiting voltage is greater than zero and less than the word voltage.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
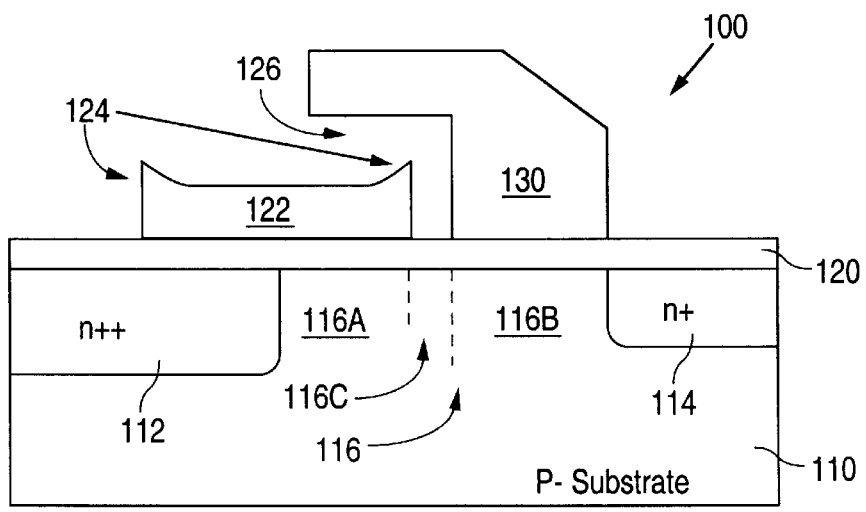
FIG. 1 is a cross-sectional diagram illustrating a prior art, split-gate flash memory cell 100.
Figure 2:
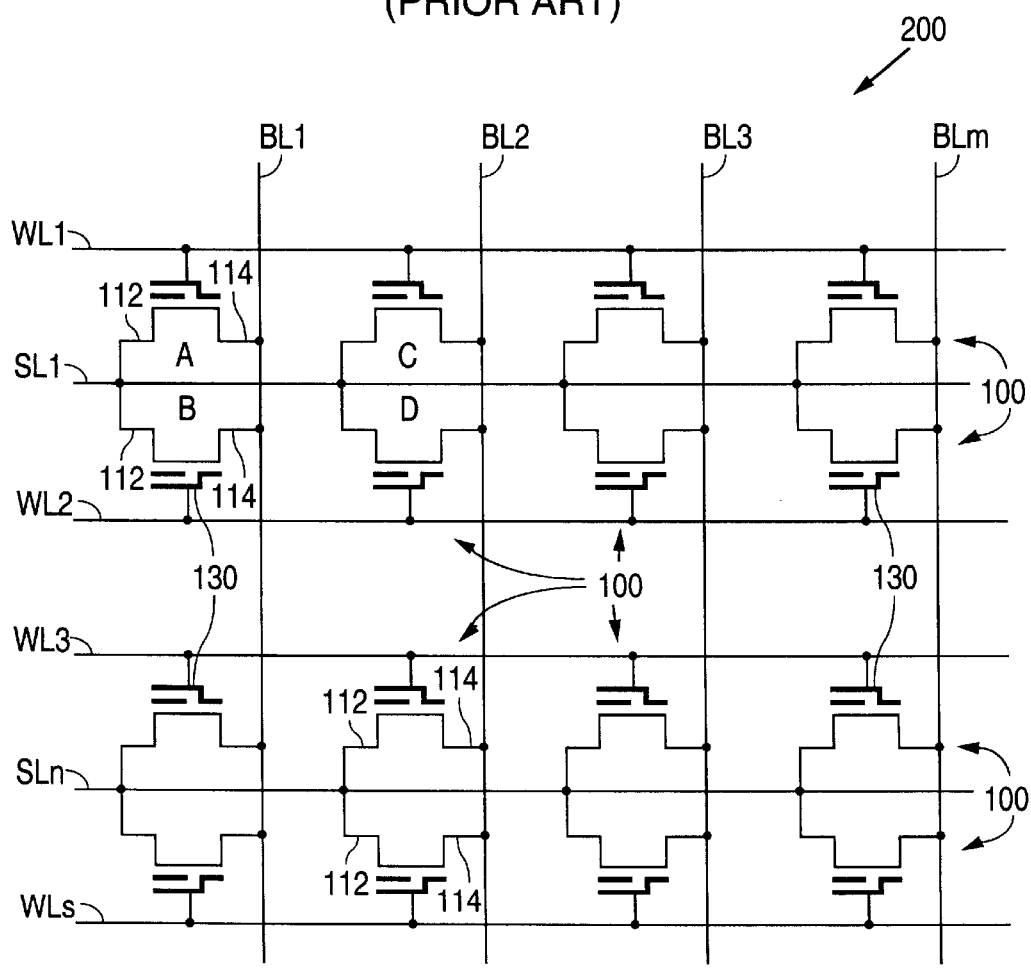
FIG. 2 is a schematic diagram illustrating a prior art, split-gate memory array 200.

The present invention is a method of programming the flash memory cells in a split-gate memory array, such as array 200. In the present method, when the memory cells 100 in a row of cells are to be programmed, a source voltage is placed on the source line that is connected to the to-be-programmed memory cells. The source voltage can be, for example, 10 volts.

In addition, during programming, ground is placed on the remaining source lines SL in array 200. For example, if memory cells 100 in the first row are to be programmed, the source voltage is placed on source line SL1, while ground is placed on the remaining source lines SLn.

Further, a first bit voltage is placed on each bit line BL that is connected to a to-be-programmed memory cell 100. In addition, a second bit voltage is placed on each bit line BL that is connected to a not to-be-programmed memory cell 100. The first bit voltage can be, for example, 1V and the second bit voltage can be, for example, 2.5V. Thus, if cell A is to be programmed and cell C is not to be programmed, then 1V is placed on bit line BL1, while 2.5V are placed on bit line BL2.

In addition, a programming voltage is placed on the word line WL that is connected to the to-be-programmed memory cells. The programming voltage can be, for example, 1.7V. A body voltage, such as ground, is also placed on substrate 110 of the memory cells in array 200.

In accordance with the present invention, an inhibiting voltage that is greater than zero and less than the programming voltage is placed on the word line WL that is connected to the row of cells that shares a source line SL with the to-be-programmed memory cells. For example, if cells in the first row are to be programmed, then the programming voltage is placed on word line WL1, while an inhibiting voltage that is greater than zero and less than the programming voltage is placed on word line WL2.

Figure 3:
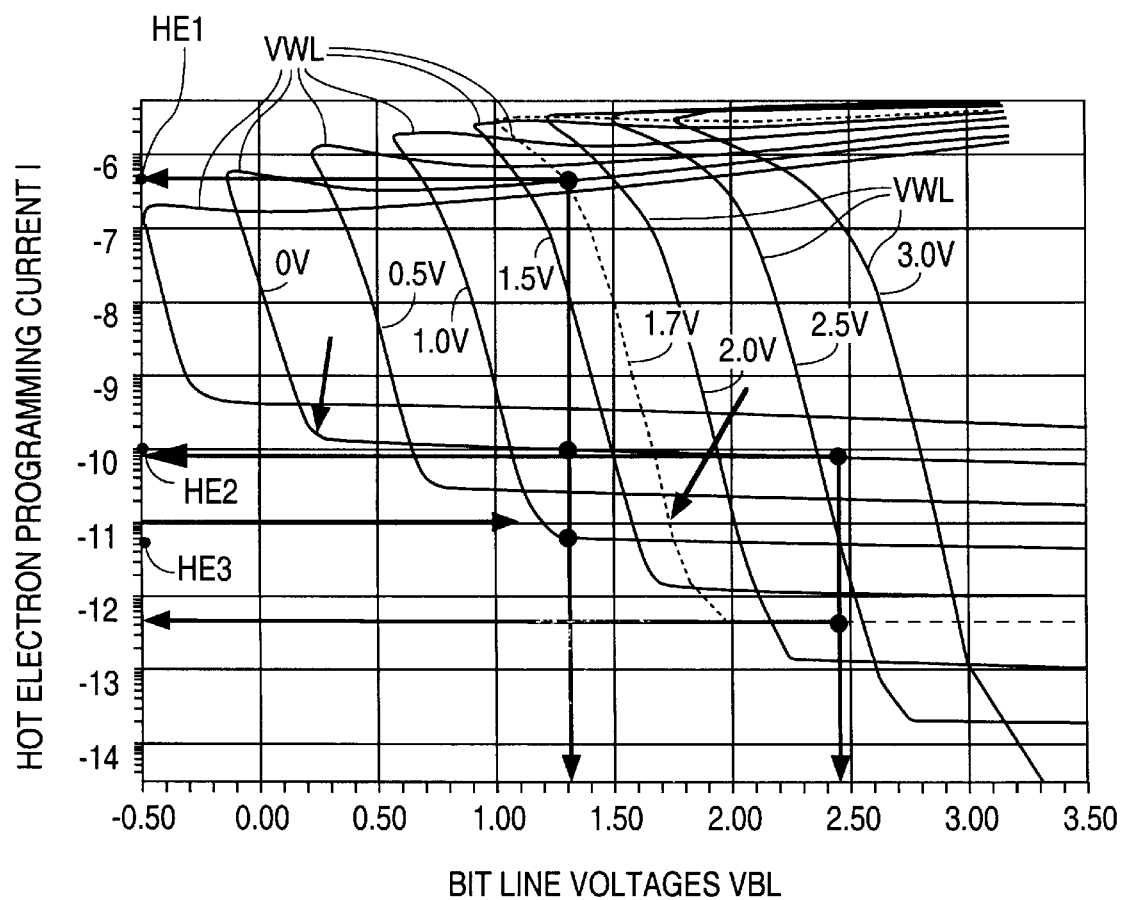
FIG. 3 is a graph illustrating the operation of a split-gate flash memory cell in accordance with the method of the present invention.

FIG. 3 shows a graph that illustrates the operation of a split-gate flash memory cell in accordance with the method of the present invention. As shown in FIG. 3, hot electron programming currents I are plotted against bit line voltages VBL for a number of word line voltages VWL assuming a source voltage of approximately 10V.

As shown in FIG. 3, when a bit line voltage VBL of 1.3V is selected, a word line voltage of approximately 1.7V generates a first hot electron programming current HE1. When a word line voltage VWL of zero is utilized, a second hot electron programming current HE2 is generated. Current HE2, in turn, is substantially less than current HE1.

As further shown in FIG. 3, in accordance with the present invention, when a word line voltage VWL greater than zero and less than approximately 1.1V is utilized, hot electron programming currents are generated that are less than the second current HE2. When the word line voltage VWL is 0.5V to 1.0V, a substantially lower programming current is obtained. In the example shown in FIG. 3, when a word line voltage VWL of approximately 1.0V is utilized, a third hot electron programming current HE3 is generated that is approximately ten times less than the second current HE2.

Thus, when the word voltage is placed on the word line/control gate of a to-be-programmed memory cell, a first hot electron current with a first magnitude is generated. In addition, when ground is placed on the word line/control gate of a not to-be-programmed memory cell, a second hot electron current with a second magnitude is generated.

Further, when the inhibiting voltage is placed on the word line/control gate of the not to-be-programmed memory cell, a third hot electron current with a third magnitude is generated. In the present invention, the second hot electron current is less than the first hot electron current, and the third hot electron current is less than the second hot electron current.

One advantage of the present invention is that the present invention increases the reliability of memory array 200 by reducing the undesirable programming that occurs when not to-be-programmed memory cells share the same source voltages as the to-be-programmed memory cells.

Another advantage of the present invention is that the inhibiting voltage reduces the potential barrier between the word line WL and the floating gate of an erased cell during programming. As noted above, approximately 10V is placed on source region 112 during programming. Due to capacitive coupling, a 7–8V potential can be present on floating gate 122 which can cause electrons on the word line WL to tunnel over to floating gate 122. By utilizing an inhibiting voltage in accordance with the present invention, the electric field across dielectric layer 126 is reduced, thereby reducing the occurrence of tunneling.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A method of programming a memory array, the memory array having:
    a plurality of memory cells formed in rows and columns, each memory cell having a source region, a drain region, a floating gate, and a control gate formed over the floating gate, a first row of cells having a to-be-programmed memory cell, a second row of cells having a first not-to-be programmed memory cell;
    a plurality of source lines formed such that each source line is connected to each source region in two adjacent rows of cells, a source line being connected to each source region in the first and second rows of cells;
    a plurality of bit lines formed such that each bit line is connected to each drain region in a column of drain regions, a bit line being connected to the drain region of the to-be-programmed memory cell and the drain region of the first not to-be-programmed memory cell;
    a plurality of word lines formed such that each word line is connected to each control gate in a row of memory cells, a first word line being connected to each control gate in the first row of memory cells, a second word line being connected to each control gate in the second row of memory cells,
    the method comprising the steps of:
        placing a source voltage on the source line connected to each source region in the first and second rows of cells;
        placing a first bit voltage on the bit line connected to the drain region of the to-be-programmed memory cell and the drain region of the first not to-be-programmed memory cell;
        placing a word voltage on the first word line; and
        placing an inhibiting voltage on the second word line, the inhibiting voltage being greater than zero and less than the word voltage.

2. The method of claim 1 wherein
    a first hot electron current with a first magnitude is generated when the word voltage is placed on the control gate of the to-be-programmed memory cell;
    a second hot electron current with a second magnitude is generated when ground is placed on the control gate of the first not to-be-programmed memory cell; and
    a third hot electron current with a third magnitude is generated when the inhibiting voltage is placed on the control gate of the first not to-be-programmed memory cell, the second hot electron current being less than the first hot electron current, the third hot electron current being less than the second hot electron current.

3. The method of claim 2 wherein the inhibiting voltage ranges from 0.5V to 1.1V.

4. The method of claim 3 wherein the inhibiting voltage is approximately 1.0V.

5. The method of claim 1 wherein
    the first row of memory cells further includes a second not to-be-programmed memory cell formed adjacent to the to-be-programmed memory cell; and
    the second row of memory cells further includes a third not to-be-programmed memory cell formed adjacent to the first not to-be-programmed memory cell,
    a second bit line being connected to the drains of the second and third not to-be-programmed memory cells,
    the method further comprising the step of applying a positive voltage to the second bit line.

6. The method of claim 5 and further comprising the step of placing ground on each remaining source line.

7. The method of claim 2 wherein
    the first row of memory cells further includes a second not to-be-programmed memory cell formed adjacent to the to-be-programmed memory cell; and
    the second row of memory cells further includes a third not to-be-programmed memory cell formed adjacent to the first not to-be-programmed memory cell,
    a second bit line being connected to the drains of the second and third not to-be-programmed memory cells,
    the method further comprising the step of applying a positive voltage to the second bit line.

8. The method of claim 1 wherein each memory cell has a channel region between the source region and the drain region, the channel region having a source-side region, a drain-side region, and an intermediate region connected to the source-side region and the drain-side region; and a layer of insulation formed over the channel region, the floating gate being formed on the layer of insulation material over the source-side region, the control gate being formed over the floating gate and on the layer of insulation over the source-side region.

9. The method of claim 8 wherein a first hot electron current with a first magnitude is generated when the word voltage is placed on the control gate of the to-be-programmed memory cell;

a second hot electron current with a second magnitude is generated when ground is placed on the control gate of the not to-be-programmed memory cell; and a third hot electron current with a third magnitude is generated when the inhibiting voltage is placed on the control gate of the not to-be-programmed memory cell, the second hot electron current being less than the first hot electron current, the third hot electron current being less than the second hot electron current.

10. The method of claim 9 wherein the inhibiting voltage ranges from 0.5V to 1.1V.

11. The method of claim 10 wherein the inhibiting voltage is approximately 1.0V.

12. The method of claim 9 wherein the first row of memory cells further includes a second not to-be-programmed memory cell formed adjacent to the to-be-programmed memory cell; and the second row of memory cells further includes a third not to-be-programmed memory cell formed adjacent to the first not to-be-programmed memory cell, a second bit line being connected to the drains of the second and third not to-be-programmed memory cells, the method further comprising the step of applying a positive voltage to the second bit line.

13. The method of claim 1 wherein the source voltage is greater than the bit voltage.

14. The method of claim 13 wherein the bit voltage is greater than zero.

* * * * *

UNITED STATES PATENT AND TRADEMARK OFFICE
CERTIFICATE OF CORRECTION

| | | |
|---|---|---|
| PATENT NO. | : 6,621,736 B1 | Page 1 of 1 |
| DATED | : September 16, 2003 | |
| INVENTOR(S) | : Mirgorodski et al. | |

It is certified that error appears in the above-identified patent and that said Letters Patent is hereby corrected as shown below:

Title page, Item [54] and Column 1, lines 2 and 3,
Delete "SPLITY-GATE" and replace with -- SPLIT-GATE --.

Signed and Sealed this

Sixth Day of January, 2004

JAMES E. ROGAN
*Director of the United States Patent and Trademark Office*